(12) United States Patent
Okeya

(10) Patent No.: US 10,747,248 B2
(45) Date of Patent: Aug. 18, 2020

(54) OSCILLATOR

(71) Applicant: SEIKO EPSON CORPORATION, Tokyo (JP)

(72) Inventor: Makoto Okeya, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/363,139

(22) Filed: Mar. 25, 2019

(65) Prior Publication Data

US 2019/0294190 A1 Sep. 26, 2019

(30) Foreign Application Priority Data

Mar. 26, 2018 (JP) ................ 2018-057732

(51) Int. Cl.
| | |
|---|---|
| *G05F 1/567* | (2006.01) |
| *G05F 3/24* | (2006.01) |
| *G05F 3/26* | (2006.01) |
| *H03B 5/04* | (2006.01) |
| *H03B 5/32* | (2006.01) |
| *H03L 5/00* | (2006.01) |
| *H01L 27/088* | (2006.01) |
| *H01L 21/8236* | (2006.01) |
| *H03F 1/30* | (2006.01) |

(52) U.S. Cl.
CPC ............ *G05F 1/567* (2013.01); *G05F 3/24* (2013.01); *G05F 3/26* (2013.01); *H01L 21/8236* (2013.01); *H01L 27/088* (2013.01); *H03B 5/04* (2013.01); *H03B 5/32* (2013.01); *H03F 1/30* (2013.01); *H03L 5/00* (2013.01); *H03B 2200/0062* (2013.01); *H03B 2200/0082* (2013.01)

(58) Field of Classification Search
CPC ... H03B 5/04; H03B 5/32; H03B 5/36; H03B 2200/0062; H03B 2200/0082; H03L 5/00; G05F 1/567; G05F 1/468; G05F 1/463; G05F 1/565; G05F 3/24; G05F 3/242; G05F 3/245; H03F 1/30
See application file for complete search history.

(56) References Cited

U.S. PATENT DOCUMENTS 6,686,792 B2 * 2/2004 Nakamiya ............... G04G 19/00
327/378
2013/0082791 A1 4/2013 Murata et al.

FOREIGN PATENT DOCUMENTS

| JP | H11-194844 A | 7/1999 |
| JP | 2011-091759 A | 5/2011 |
| JP | 5788755 B2 | 10/2015 |

\* cited by examiner

*Primary Examiner* — Ryan Johnson
(74) *Attorney, Agent, or Firm* — Oliff PLC

(57) ABSTRACT

Across the entire operating temperature range, and without requiring a new transistor element, the constant voltage output by a constant voltage circuit can be controlled to a voltage greater than or equal to the stop-oscillating voltage and as low as possible. A resistance 11b that negatively feeds back a reference current Iref is connected between the gate and source of a depletion mode n-channel transistor 11a configured to produce the reference current Iref on which the constant voltage VREG is based. The resistance of resistance 11b has a gradient to temperature change of the same sign as the gradient of the difference between the constant voltage and the stop-oscillating voltage to temperature change when the gradient of the resistance value of the resistance to temperature change is 0.

6 Claims, 2 Drawing Sheets

OSCILLATOR

BACKGROUND

1. Technical Field

The present invention relates to an oscillator used in electronic devices.

2. Related Art

Oscillators comprising a constant voltage circuit that produces a constant voltage, and a crystal oscillation circuit that drives a crystal oscillator by using the constant voltage that was produced, are known from the literature. Such oscillators are commonly used in timepieces, cell phones, and other electronic devices in which suppressing current consumption is desirable. Suppressing current consumption by the oscillator requires minimizing the voltage need to drive the crystal oscillation circuit.

A common crystal oscillation circuit has a stop-oscillating voltage that is determined by such factors as the oscillation characteristics of the crystal oscillator, oscillation inverter, and load capacitance. The stop-oscillating voltage is known to drop linearly on a gradient to a known temperature change in the operating temperature range, typically −40° C.-80° C., for example. Therefore, to suppress the current consumption of the oscillator within the operating temperature range, the constant voltage output by the constant voltage circuit must be greater than the stop-oscillating voltage and as close as possible to the stop-oscillating voltage. As a result, the gradient of the constant voltage to the temperature change in the operating temperature range must be as close as possible to the gradient of the stop-oscillating voltage to the temperature change. Japan Patent 5788755 describes controlling the gradient of the constant voltage output by the constant voltage circuit to the temperature change to near the gradient of the stop-oscillating voltage to the temperature change by changing the threshold voltage of a depletion mode transistor configuring the current source of the constant voltage circuit.

However, with the technology of the related art described above, the gradient of the stop-oscillating voltage to the temperature change differs according to the crystal oscillation circuit. Producing an oscillator with suppressed current consumption is difficult with the technology of the related art because, in the manufacturing process of a semiconductor device including a constant voltage circuit and a crystal oscillation circuit, the threshold voltage of the depletion mode transistor of the constant current source in the constant voltage circuit must be adjusted according to the gradient of the stop-oscillating voltage of the crystal oscillation circuit combined with the constant voltage circuit to temperature change.

SUMMARY

An oscillator according to one aspect of the invention includes a constant voltage circuit including a constant current source that generates a reference current, and a constant voltage generator that generates a constant voltage according to the reference current; and an oscillation circuit configured to oscillate when the constant voltage is applied, and stop oscillating when the constant voltage goes to or below a stop-oscillating voltage in a specific temperature range. The constant current source includes a depletion mode transistor configured to produce the reference current, and a feedback element configured to negatively feed the reference current back to between a gate and source of the transistor. The resistance of the feedback element has a gradient to temperature change whereby the gradient of the difference between the constant voltage and the stop-oscillating voltage to temperature change approaches 0.

In this configuration, the feedback element is a resistance.

By controlling the gradient of the resistance of the feedback element to temperature change, the gradient of the difference between the constant voltage and the stop-oscillating voltage to temperature change approaches 0. As a result, in the operating temperature range, the constant voltage output by the constant voltage circuit is greater than the stop-oscillating voltage and close to the stop-oscillating voltage, and current consumption by the oscillation circuit can be reduced.

Preferably in another aspect of the invention, the constant voltage generator produces a constant voltage that increases as the reference current increases; and the sign of the gradient of the resistance of the feedback element to temperature change is the same as the sign of the gradient of the difference between the constant voltage and the stop-oscillating voltage to temperature change when the gradient of the resistance of the feedback element to temperature change is 0.

In this aspect of the invention, when the gradient of the feedback element resistance to temperature change is 0, and the sign of the gradient of the difference between the constant voltage and the stop-oscillating voltage is negative, the gradient of the feedback element resistance to temperature change is negative. Feedback element resistance therefore decreases as the temperature increases, and because feedback decreases, the reference current rises and the constant voltage rises. As a result, the gradient of the difference between the constant voltage and stop-oscillating voltage to the temperature change in a specific temperature range approaches zero.

However, when the gradient of the feedback element resistance to temperature change is 0, and the sign of the gradient of the difference between the constant voltage and the stop-oscillating voltage is positive, the gradient of the feedback element resistance to temperature change is positive. Feedback element resistance therefore increases as the temperature increases, and because feedback increases, the reference current decreases and the constant voltage drops. As a result, the gradient of the difference between the constant voltage and stop-oscillating voltage to the temperature change in a specific temperature range approaches zero.

Preferably in another aspect of the invention, the constant voltage generator produces a constant voltage that decreases as the reference current increases; and the sign of the gradient of the resistance of the feedback element to temperature change is the different from the sign of the gradient of the difference between the constant voltage and the stop-oscillating voltage to temperature change when the gradient of the resistance of the feedback element to temperature change is 0.

In this aspect of the invention, when the gradient of the feedback element resistance to temperature change is 0, and the sign of the gradient of the difference between the constant voltage and the stop-oscillating voltage is negative, the gradient of the feedback element resistance to temperature change is positive. Feedback element resistance therefore increases as the temperature rises, and because feedback increases, the reference current drops and the constant voltage rises. As a result, the gradient of the difference between the constant voltage and stop-oscillating voltage to the temperature change in a specific temperature range approaches zero.

However, when the gradient of the feedback element resistance to temperature change is 0, and the sign of the gradient of the difference between the constant voltage and the stop-oscillating voltage is positive, the gradient of the feedback element resistance to temperature change is negative. Feedback element resistance therefore decreases as the temperature increases, and because feedback decreases, the reference current increases and the constant voltage drops. As a result, the gradient of the difference between the constant voltage and stop-oscillating voltage to the temperature change in a specific temperature range approaches zero.

Other objects and attainments together with a fuller understanding of the invention will become apparent and appreciated by referring to the following description and claims taken in conjunction with the accompanying drawings.

DESCRIPTION OF EMBODIMENTS

Embodiment 1

A preferred embodiment of the invention is described below with reference to the accompanying figures.

Figure 1:
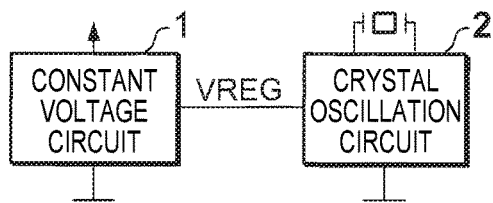
FIG. 1 is a block diagram illustrating the configuration of an oscillator according to a preferred embodiment of the invention.

FIG. 1 is a block diagram illustrating the configuration of an oscillator according to a preferred embodiment of the invention. This oscillator includes a constant voltage circuit 1, and a crystal oscillation circuit 2. The constant voltage circuit 1 outputs constant voltage VREG. The crystal oscillation circuit 2 operates with constant voltage VREG as the supply voltage. The stop-oscillating voltage VSTO of the crystal oscillation circuit 2 depends on the characteristics of the crystal oscillator, the characteristics of an oscillation inverter, and load capacitance, and drops linearly relative to the rise in temperature. In other words, the stop-oscillating voltage VSTO has a negative gradient to temperature change.

Figure 2:
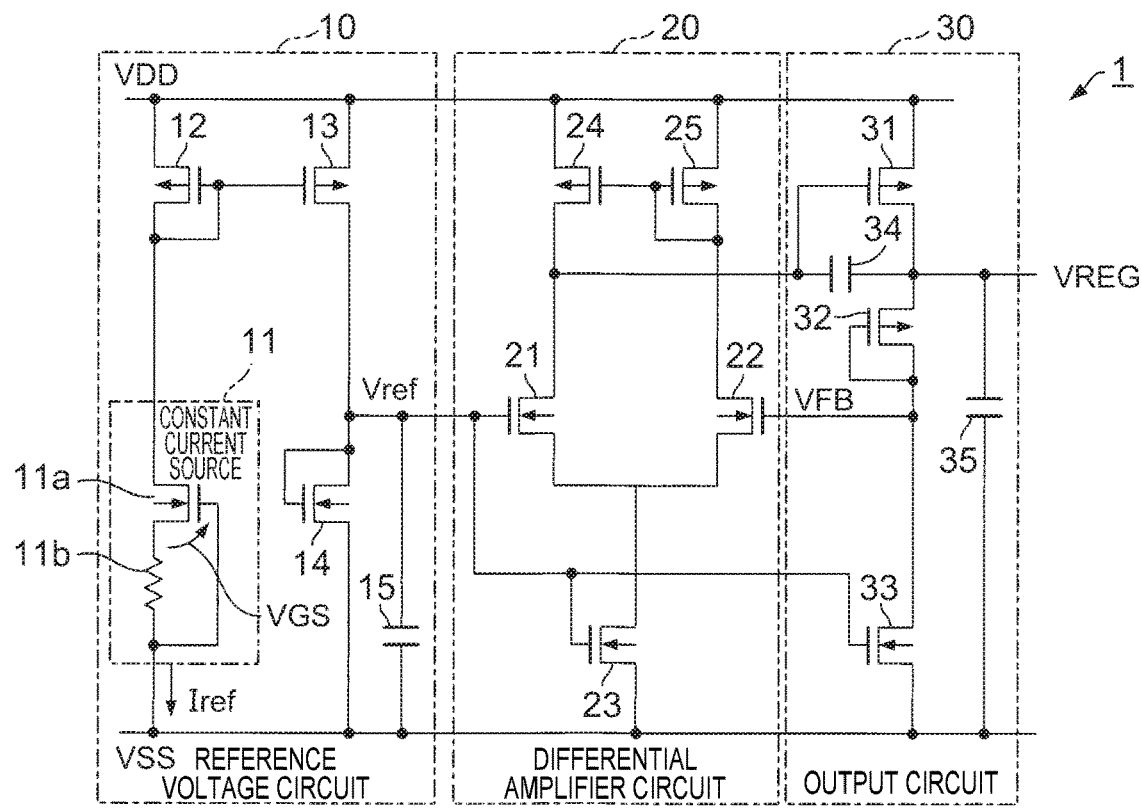
FIG. 2 is a circuit diagram showing the configuration of the constant voltage circuit in the same embodiment.

FIG. 2 is a circuit diagram showing an example of the configuration of the constant voltage circuit 1. As shown in FIG. 2, the constant voltage circuit 1 has a reference voltage circuit 10, differential amplifier circuit 20, and output circuit 30.

The reference voltage circuit 10 includes a constant current source 11, p-channel transistors 12 and 13, n-channel transistor 14, and capacitor 15.

The source of the p-channel transistor 12 connects to high potential source VDD, and the drain and gate connect to a common node. The constant current source 11 is inserted between the common node of the drain and gate of the p-channel transistor 12, and the low potential source VSS.

The source of the p-channel transistor 13 connects to high potential source VDD, and the gate connects to the gate and drain of the p-channel transistor 12.

The source of the n-channel transistor 14 connects to low potential source VSS, and the gate and drain connect to the drain of the p-channel transistor 13.

The p-channel transistor 13 and p-channel transistor 12 function as a current mirror that passes current corresponding to the reference current Iref flowing through the constant current source 11 to the n-channel transistor 14. The n-channel transistor 14 outputs reference voltage Vref from the drain when current corresponding to the reference current Iref flows. This reference voltage Vref depends on reference current Iref, and rises as reference current Iref increases. The capacitor 15 connected parallel to the n-channel transistor 14 functions to stabilize the reference voltage Vref.

The differential amplifier circuit 20 includes n-channel transistors 21-23, and p-channel transistors 24 and 25.

The sources of n-channel transistors 21 and 22 connect to a common node, configuring a differential transistor pair. The reference voltage Vref is applied to the gate of n-channel transistor 21. A feedback voltage VFB from the output circuit 30 side is applied to the gate of n-channel transistor 22.

The drain of n-channel transistor 23 connects to the common node between the sources of n-channel transistors 21 and 22, and the source of n-channel transistor 23 connects to low potential source VSS. The reference voltage Vref is applied to the gate of n-channel transistor 23. As a result, n-channel transistor 23 functions as a constant current source of a current corresponding to reference current Iref.

The source of p-channel transistor 24 connects to high potential source VDD, and the drain connects to the drain of n-channel transistor 21.

The source of p-channel transistor 25 connects to high potential source VDD, and the drain connects to the drain of n-channel transistor 22. The gates of p-channel transistors 24 and 25 connect to a common node between the drains of p-channel transistor 25 and n-channel transistor 22.

The differential amplifier circuit 20 differentially amplifies reference voltage Vref and feedback voltage VFB, and a signal that is the differentially amplified result is output from the drain of n-channel transistor 21 to the output circuit 30.

The output circuit 30 has p-channel transistors 31 and 32, n-channel transistor 33, and capacitors 34 and 35.

The source of p-channel transistor 31 connects to high potential source VDD, and the gate connects to the drain of n-channel transistor 21 in the differential amplifier circuit 20. A phase compensation capacitor 34 is inserted between the gate and drain of the p-channel transistor 31.

The source of p-channel transistor 32 connects to the drain of p-channel transistor 31, and the gate and drain are connected to a common node.

The source of n-channel transistor 33 connects to low potential source VSS, and the drain connects to a common node connecting the gate and drain of p-channel transistor 32. The reference voltage Vref is applied to the gate of n-channel transistor 33. The n-channel transistor 33 therefore functions as a constant current source of a current corresponding to reference current Iref.

In this output circuit 30, the drain voltage of the n-channel transistor 33 is supplied as feedback voltage VFB to the gate of the n-channel transistor 22 in the differential amplifier circuit 20. The drain voltage of the p-channel transistor 31 is also output as constant voltage VREG. The capacitor 35 inserted between the drain of p-channel transistor 31 and low potential source VSS functions to stabilize the constant voltage VREG. The p-channel transistor 32 of which the gate and drain are connected to a common node is inserted between the constant voltage VREG node and the feedback voltage VFB node. As a result, feedback voltage VFB goes to a voltage equal to constant voltage VREG minus the threshold voltage of the p-channel transistor 32.

In the configuration described above, the circuit of the reference voltage circuit 10 minus the constant current source 11, the differential amplifier circuit 20, and the output circuit 30 function as a constant voltage generator that produces a constant voltage VREG dependent on the reference current Iref.

More specifically, if the feedback voltage VFB becomes greater than the reference voltage Vref determined by the reference current Iref, the drain current of then-channel transistor 21 decreases. As a result, the drain voltage of the n-channel transistor 21 rises, the ON resistance of the p-channel transistor 31 increases, and feedback voltage VFB drops.

However, if the feedback voltage VFB becomes less than the reference voltage Vref determined by the reference current Iref, the drain current of the n-channel transistor 21 increases. As a result, the drain voltage of the n-channel transistor 21 drops, the ON resistance of the p-channel transistor 31 decreases, and feedback voltage VFB rises.

As a result of this negative feedback, feedback voltage VFB becomes equal to reference voltage Vref, and constant voltage VREG goes to a voltage that is higher than the feedback voltage VFB (=reference voltage Vref) by a voltage equivalent to the threshold voltage of the p-channel transistor 32.

The constant voltage circuit 1 therefore produces a reference voltage Vref corresponding to the reference current Iref, resulting in a constant voltage VREG corresponding to the reference voltage Vref. Because the reference voltage Vref rises with the increase in the reference current Iref in this constant voltage circuit 1, the constant voltage VREG also rises with the increase in the reference current Iref.

The constant current source 11 of the reference voltage circuit 10 in this embodiment is configured with a depletion mode n-channel transistor 11a that produces reference current Iref, and a resistance 11b, which is a feedback element that negatively feeds reference current Iref back to between the gate and source of the n-channel transistor 11a.

More specifically, the drain of the n-channel transistor 11a connects to the drain of p-channel transistor 12, and the gate connects to low potential source VSS. The resistance 11b is inserted between the source of n-channel transistor 11a and low potential source VSS.

Because the depletion mode n-channel transistor 11a is doped with a high concentration impurity below the gate and has a negative threshold voltage, a channel is formed below the gate even when the voltage between the gate and source is 0 V. As a result, the n-channel transistor 11a functions as a constant current source when the gate and source are shorted as shown in FIG. 2. In this constant current source 11, reference current Iref flows to resistance 11b between the source of n-channel transistor 11a and the low potential source VSS, producing negative feedback reducing, by the voltage drop of the resistance 11b, the bias between the gate and source that contributes to channel formation in the n-channel transistor 11a. When the resistance of the resistance 11b increases, negative feedback increases, the reference current Iref decreases, and the resistance of the resistance 11b decreases, negative feedback decreases and the reference current Iref increases.

To manufacture a semiconductor device with a crystal oscillator according to this embodiment of the invention, a structure having a temperature characteristic that can make the gradient of the difference between the constant voltage VREG output by the constant voltage circuit 1 and the stop-oscillating voltage VSTO of the crystal oscillation circuit 2 to the temperature change close to zero (0), that is, the gradient of resistance to the temperature change, is formed as resistance 11b, which is the feedback element.

More specifically, because constant voltage VREG rises with the increase in reference current Iref in this embodiment, a resistance with a gradient to temperature change of the same sign as the gradient of the difference between constant voltage VREG and stop-oscillating voltage VSTO to temperature change when the gradient of the resistance of resistance 11b to temperature change is zero (0) is manufactured as resistance 11b. As a result, in the operating temperature range of the oscillator, constant voltage VREG can be made greater than stop-oscillating voltage VSTO, and as close as possible to stop-oscillating voltage VSTO.

Figure 3:
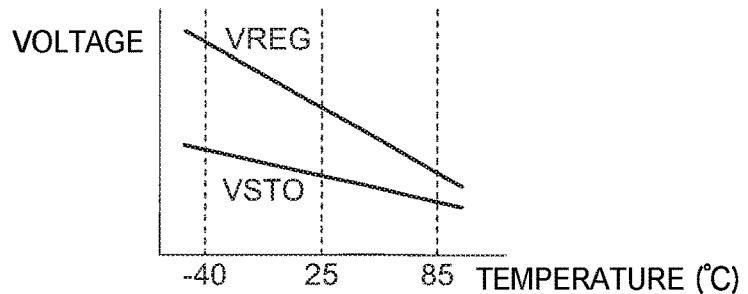
FIG. 3 is a graph showing an example of the temperature characteristic of the constant voltage produced by the constant voltage circuit, and the stop-oscillating voltage of the crystal oscillation circuit, when the gradient of the resistance of the feedback element to temperature change is assumed to be 0 in the same embodiment.

Operation of this embodiment of the invention is described next. FIG. 3 is a graph showing an example of the temperature characteristic of the constant voltage VREG and the stop-oscillating voltage VSTO when the gradient of the resistance of the feedback element to temperature change is assumed to be 0.

In this example, the gradient of the difference between the constant voltage VREG and stop-oscillating voltage VSTO to temperature change is negative, and as temperature rises, constant voltage VREG goes closer to stop-oscillating voltage VSTO. To avoid constant voltage VREG going below stop-oscillating voltage VSTO in the operating temperature range, the constant voltage VREG must be sufficiently high. However, this increases the current consumption of the crystal oscillation circuit 2.

Figure 4:
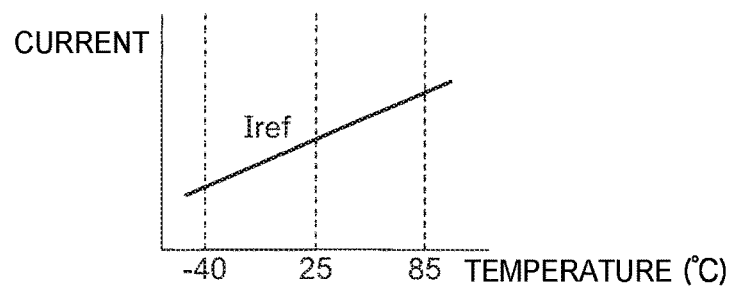
FIG. 4 is a graph showing an example of the temperature characteristic of the reference current produced by the constant current source of the constant voltage circuit in the same embodiment.

In this embodiment of the invention, the resistance 11b is a resistance producing a negative gradient of resistance to temperature change. When this resistance 11b is used, negative feedback from the resistance 11b in the constant current source 11 decreases as temperature increases. As a result, as shown in FIG. 4, reference current Iref increases as temperature increases, and as reference current Iref increases, constant voltage VREG rises.

Figure 5:
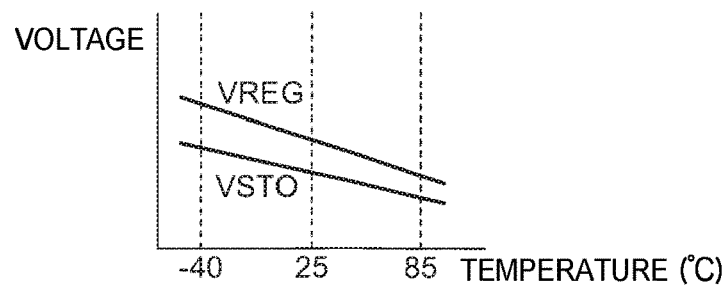
FIG. 5 is a graph showing an example of the temperature characteristic of the constant voltage produced by the constant voltage circuit, and the stop-oscillating voltage of the crystal oscillation circuit in the same embodiment.

As a result, as shown in FIG. 5, the gradient of constant voltage VREG to temperature change is more gradual, and the gradient of constant voltage VREG to temperature change closely approaches the gradient of the stop-oscillating voltage VSTO to temperature change. As a result, across the entire operating temperature range, constant voltage VREG is greater than or equal to stop-oscillating voltage VSTO and as low as possible.

Figure 6:
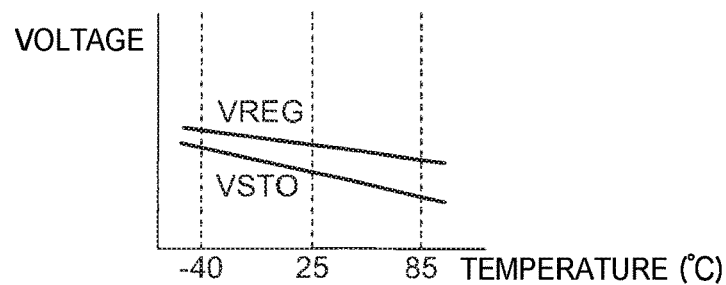
FIG. 6 is a graph showing another example of the temperature characteristic of the constant voltage produced by the constant voltage circuit, and the stop-oscillating voltage of the crystal oscillation circuit, when the gradient of the resistance of the feedback element to temperature change is assumed to be 0 in the same embodiment.

In the example in FIG. 6, when the gradient of the resistance of resistance 11b to temperature change is 0, the gradient of the difference between constant voltage VREG and stop-oscillating voltage VSTO to temperature change is positive, and as temperature rises, constant voltage VREG deviates from stop-oscillating voltage VSTO.

In this case, resistance 11b is a resistance where the gradient of the resistance to temperature change is positive. When this resistance 11b is used, negative feedback by the resistance 11b in the constant current source 11 increases as temperature rises. As a result, reference current Iref decreases as temperature rises, and constant voltage VREG decreases according to the decrease in reference current Iref.

Figure 7:
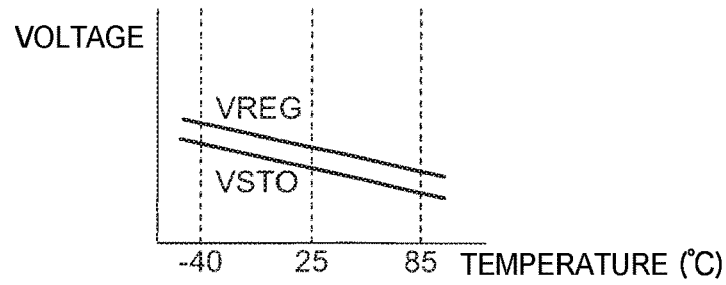
FIG. 7 is a graph showing another example of the temperature characteristic of the constant voltage produced by the constant voltage circuit, and the stop-oscillating voltage of the crystal oscillation circuit in the same embodiment.

As a result, as shown in FIG. 7, the gradient of constant voltage VREG to temperature change is steeper, and the gradient of constant voltage VREG to temperature change approaches the gradient of stop-oscillating voltage VSTO to temperature change. As a result, across the entire operating temperature range, constant voltage VREG can be kept greater than or equal to stop-oscillating voltage VSTO and as low as possible.

Because the temperature characteristics of the constant voltage circuit 1 can be adjusted by adjusting the temperature characteristics of the resistance 11b, which is a feedback element, this embodiment of the invention enables easily controlling the constant voltage to a voltage greater than or equal to the stop-oscillating voltage and as low as possible across the entire operating temperature range, without needing to produce a new transistor element.

Other Embodiments

A preferred embodiment of the invention is described above, but other embodiments are also conceivable. Some examples are described below.

(1) In the embodiment described above, because constant voltage VREG rises as reference current Iref increases, a resistance having a gradient to temperature change that is the same as the gradient of the difference between constant voltage VREG and stop-oscillating voltage VSTO to temperature change when the gradient of the resistance of resistance 11b to temperature change is 0 is formed as resistance 11b.

However, depending on the configuration of the reference voltage circuit 10, constant voltage VREG may drop as reference current Iref increases. In this case, a resistance having a gradient to temperature change of a different sign than the gradient of the difference between constant voltage VREG and stop-oscillating voltage VSTO to temperature change when the gradient of the resistance of resistance 11b to temperature change is 0 is formed as resistance 11b. This configuration has the same effect as the embodiment described above.

(2) In the embodiment described above the feedback element is a resistance, but the invention is not so limited and a device other than a resistance, such as a transistor, may be used as the feedback element.

(3) The resistance 11b that is the feedback element may be a resistor externally disposed to the semiconductor oscillator device. In this case, the resistance externally disposed to the semiconductor device can be selected from a wider range of devices than a resistance formed inside the semiconductor device, and a resistance with the desired temperature characteristics can be achieved more easily.

(4) The invention may be configured as an oscillator as described according to the embodiment described above, but the oscillator may also be configured in a movement for a timepiece, or as a timepiece having the same timepiece movement.

The invention being thus described, it will be obvious that it may be varied in many ways. Such variations are not to be regarded as a departure from the spirit and scope of the invention, and all such modifications as would be obvious to one skilled in the art are intended to be included within the scope of the following claims.

The entire disclosure of Japanese Patent Application No. 2018-57732, filed Mar. 26, 2018 is expressly incorporated by reference herein.

What is claimed is:

1. An oscillator comprising:
a constant voltage circuit including a constant current source that generates a reference current, and a constant voltage generator that generates a constant voltage according to the reference current; and
an oscillation circuit configured to oscillate when the constant voltage is applied, and stop oscillating when the constant voltage goes to or below a stop-oscillating voltage in a specific temperature range;
the constant current source including:
a depletion mode transistor configured to produce the reference current; and
a feedback element connected between a gate and source of the transistor;
a resistance of the feedback element having a gradient to temperature change whereby the gradient of a difference between the constant voltage and the stop-oscillating voltage to temperature change is 0.

2. The oscillator described in claim 1, wherein:
the constant voltage increases as the reference current increases; and
when the gradient of the resistance of the feedback element to temperature change is 0, a sign of the gradient of the resistance of the feedback element to temperature change is the same as a sign of the gradient of the difference between the constant voltage and the stop-oscillating voltage to temperature change.

3. The oscillator described in claim 1, wherein:
the constant voltage generator produces a constant voltage that decreases as the reference current increases; and
when the gradient of the resistance of the feedback element to temperature change is 0, a sign of the gradient of the resistance of the feedback element to temperature change is the different from a sign of the gradient of the difference between the constant voltage and the stop-oscillating voltage to temperature change.

4. The oscillator described in claim 1, wherein the feedback element is a resistance.

5. A timepiece movement comprising an oscillator as described in claim 1.

6. A timepiece comprising a timepiece movement as described in claim 5.

* * * * *